(12) United States Patent
Thakur et al.

(10) Patent No.: US 8,709,537 B2
(45) Date of Patent: Apr. 29, 2014

(54) METHODS FOR ENHANCING TANTALUM FILAMENT LIFE IN HOT WIRE CHEMICAL VAPOR DEPOSITION PROCESSES

(75) Inventors: Bipin Thakur, Mumbai (IN); Joe Griffith Cruz, San Jose, CA (US); Stefan Keller, Mainaschaff (DE); Vikas Gujar, Thane (IN); Ravindra Janu Patil, Thane (IN)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 13/267,309

(22) Filed: Oct. 6, 2011

(65) Prior Publication Data

US 2012/0100312 A1    Apr. 26, 2012

Related U.S. Application Data

(60) Provisional application No. 61/405,670, filed on Oct. 22, 2010.

(51) Int. Cl.
*C23C 16/00* (2006.01)

(52) U.S. Cl.
USPC ...................................... 427/248.1

(58) Field of Classification Search
CPC ............................... C23C 16/24; C23C 16/44
USPC .................................................. 427/248.1
See application file for complete search history.

(56) References Cited

U.S. PATENT DOCUMENTS

| 7,220,665 | B2 |   | 5/2007 | Farrar |           |
| 7,727,590 | B2 | * | 6/2010 | Richardson et al. | 427/249.11 |
| 8,043,976 | B2 |   | 10/2011 | Vrtis et al. |          |
| 2002/0189545 | A1 | * | 12/2002 | Matsumura et al. | 118/724 |
| 2008/0138994 | A1 |   | 6/2008 | Ueda et al. |          |
| 2009/0038541 | A1 | * | 2/2009 | Robbins et al. | 117/104 |

FOREIGN PATENT DOCUMENTS

JP          11-202099 A        7/1999

OTHER PUBLICATIONS

Hrunski et al. Problem of catalyst ageing during the hot-wire chemical vapour deposition of thin silicon films, Thin Solid Films, 517 (2009) pp. 3370-3377.*
Knoesen et al. Extension of the lifetime of tantalum filaments in the hot wire (Cat) chemical vapor deposition process, Thin Solid Films, 516 (2008) pp. 822-825.*
Knoesen et al. Extension of the lifetime of tantalum filmaments in the hot-wire (Cat) Chemical Vapor Deposition process, Thin Solid Films 516 (2008) pp. 822-825.*
International Search Report and Written Opinion mailed Apr. 17, 2012 for PCT Application No. PCT/US2011/057022.

* cited by examiner

*Primary Examiner* — Kelly M Gambetta
(74) *Attorney, Agent, or Firm* — Moser Taboada; Alan Taboada

(57) ABSTRACT

Methods for depositing films using hot wire chemical vapor deposition (HWCVD) processes are provided herein. In some embodiments, a method of operating an HWCVD tool may include providing hydrogen gas ($H_2$) to a filament disposed in a process chamber of the HWCVD tool for a first period of time; and flowing current through the filament to raise the temperature of the filament to a first temperature after the first period of time.

16 Claims, 2 Drawing Sheets

US 8,709,537 B2

METHODS FOR ENHANCING TANTALUM FILAMENT LIFE IN HOT WIRE CHEMICAL VAPOR DEPOSITION PROCESSES

CROSS-REFERENCE TO RELATED APPLICATIONS

This application claims benefit of U.S. provisional patent application Ser. No. 61/405,670, filed Oct. 22, 2010, which is herein incorporated by reference in its entirety.

FIELD

Embodiments of the present invention generally relate to methods for depositing material on substrates using hot wire chemical vapor deposition (HWCVD) processes, and more specifically, to methods for enhancing the lifetime of filaments used in such processes.

BACKGROUND

In HWCVD processes, one or more precursor gases are thermally decomposed at a high temperature within a process chamber proximate a substrate upon which a desired material is to be deposited. The thermal decomposition reaction is facilitated within the process chamber by one or more wires, or filaments, supported in the process chamber that may be heated to a desired temperature, for example, by passing electrical current through the filaments.

Use of different filament materials may have an impact on the quality of deposited films. For example, using tantalum filaments in HWCVD applications may result in better quality deposited films, as compared to using tungsten filaments. Unfortunately, however, the inventors have observed that tantalum filaments can be more susceptible to oxidation under certain operating regimes. This undesirably may lead to reduction in current flow through the filament, reduction in the filament temperature, and ultimately, breakage of the filament. The inventors have further observed that this reduction in performance and breakage of the tantalum filament occurs quickly, and thus, tantalum filaments cannot be used for elongated time periods.

Therefore, the inventors have provided improved methods for depositing films using HWCVD processes.

SUMMARY

Methods for depositing films using hot wire chemical vapor deposition (HWCVD) processes are provided herein. In some embodiments, a method of operating an HWCVD tool may include providing hydrogen gas ($H_2$) to a filament disposed in a process chamber of the HWCVD tool for a first period of time; and flowing current through the filament to raise the temperature of the filament to a first temperature after the first period of time.

In some embodiments, a method of operating an HWCVD tool may include preconditioning a filament disposed in a process chamber of the HWCVD tool in a hydrogen gas ($H_2$)-containing atmosphere; flowing current through the filament to raise the temperature of the filament to a first temperature after preconditioning the filament; providing a process gas to the process chamber after the filament is at the first temperature; and depositing a material on the substrate using species decomposed from the process gas.

In some embodiments, the invention may be embodied in a computer readable medium having instructions stored thereon that, when executed, cause a method to be performed in a HWCVD tool, the method may include any of the embodiments disclosed herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
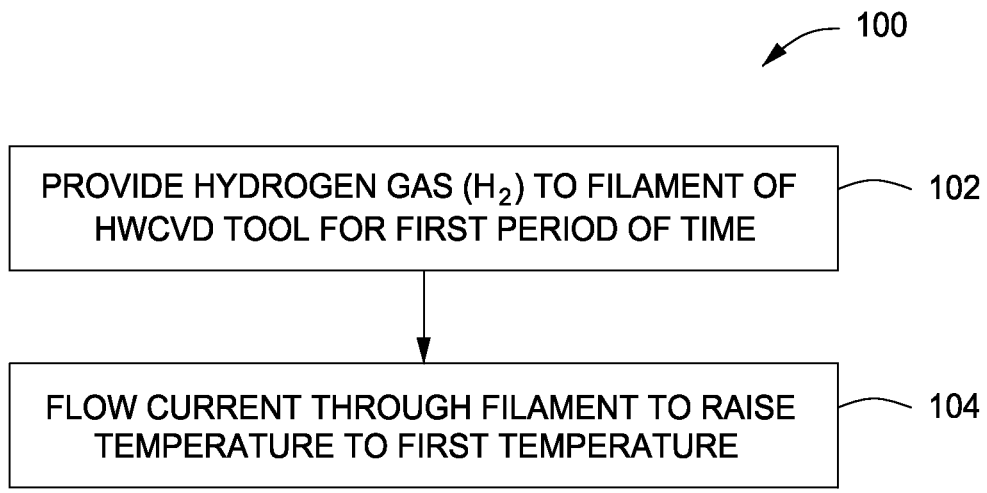
FIG. 1 depicts a flow chart for a method of operating a hot wire chemical vapor deposition (HWCVD) tool in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide hot wire chemical vapor deposition (HWCVD) processing techniques that may advantageously eliminate or reduce the rapid oxidation of tantalum filaments in HWCVD processes, thereby substantially enhancing the filament life and facilitating extended use of tantalum filaments in HWCVD processes. Embodiments of the present invention may thus provide one or more of the following benefits: improved film quality as compared to use of tungsten filaments, extended filament lifetime, greater equipment uptime, higher yield, and higher throughput.

While firing new tantalum filaments in temperature range 1500-2000 degrees Celsius at pressures of greater than about 10 mTorr (e.g., typical HWCVD operating conditions for certain applications such as the deposition of silicon films), the inventors have observed a rapid decrease in the temperature of the filament over time, accompanied by a diminishing filament glow. The inventors believe that the reduction in temperature is due to oxidation of the tantalum filament. However, the inventors have discovered that when a new tantalum filament is fired up in the presence of hydrogen ($H_2$) gas (e.g., a hydrogen ambient), the rate of filament oxidation (as measured by the filament temperature) slows down. The inventors have developed methods of operating a HWCVD tool that incorporate embodiments of this technique, as discussed in greater detail below.

FIG. 1 depicts a flow chart for a method 100 of operating a HWCVD tool in accordance with some embodiments of the present invention. The method generally begins at 102 where hydrogen ($H_2$) gas is provided to a filament (or a plurality of filaments) disposed in a process chamber of the HWCVD tool for a first period of time. The hydrogen ($H_2$) gas may be provided by itself, or along with an inert carrier gas, such as nitrogen, helium, argon, or the like. The flow rate of the hydrogen ($H_2$) gas may be sufficient to blanket, or cover, the filaments within the HWCVD chamber. As such, the specific flow rates will vary depending upon the size of the chamber and surface area of the filaments (e.g., length and number of filaments). For example, in some embodiments, the hydrogen ($H_2$) gas may be provided at a flow rate of from about 10 to about 500 sccm. When provided along with the carrier gas, the concentration of the hydrogen ($H_2$) gas within the carrier gas may be from about 5 to about 80 percent by volume. In some embodiments, the first period of time may be selected to facilitate scavenging residual oxygen from the reactor. In some embodiments, the first period of time may be selected to allow for the hydrogen to completely cover, or blanket the filaments, to prevent unwanted reactions—such as oxidation—between gases in the chamber and the filaments. In some embodiments, the first period of time may range from about 5 to about 1800 seconds.

Next, at 104, a current may be flowed through the filaments to raise the temperature of the filaments to a first temperature after the first period of time. Current may be provided to the filaments from a power source. The amount of current provided may be selected to raise the temperature of the filaments to the first temperature. In some embodiments, the first temperature may be a temperature at which a deposition process is to be subsequently carried out. In some embodiments, the first temperature may be greater than or less than a temperature at which the deposition process is to be carried out. In some embodiments, the temperature may be between about 1500 to about 2400 degrees Celsius (although other temperatures may be used). The second period of time may be selected to allow the filaments to reach the first temperature. In some embodiments, the second period of time may be selected to facilitate forming an envelope of hydrogen radicals about the filaments. In some embodiments, the second period of time may range from about 5 to about 1800 seconds.

Upon completion of the second period of time, the method 100 generally ends. In some embodiments, the method 100, or portions thereof, may be used as a preconditioning step prior to a deposition process. For example, in some embodiments, after conditioning the filaments as described above, the current may continue to be provided to the filaments to maintain the first temperature and process gases may be provided to the chamber to deposit materials on the substrate. When serially processing substrates, the conditioning process may be initially performed and many substrates may be passed through the chamber, in some embodiments with the process gases continually flowing, to continuously deposit materials on sequential substrates. In some embodiments, the process gas may be turned off and the current flow ceased after the last substrate is processed.

Figure 2:
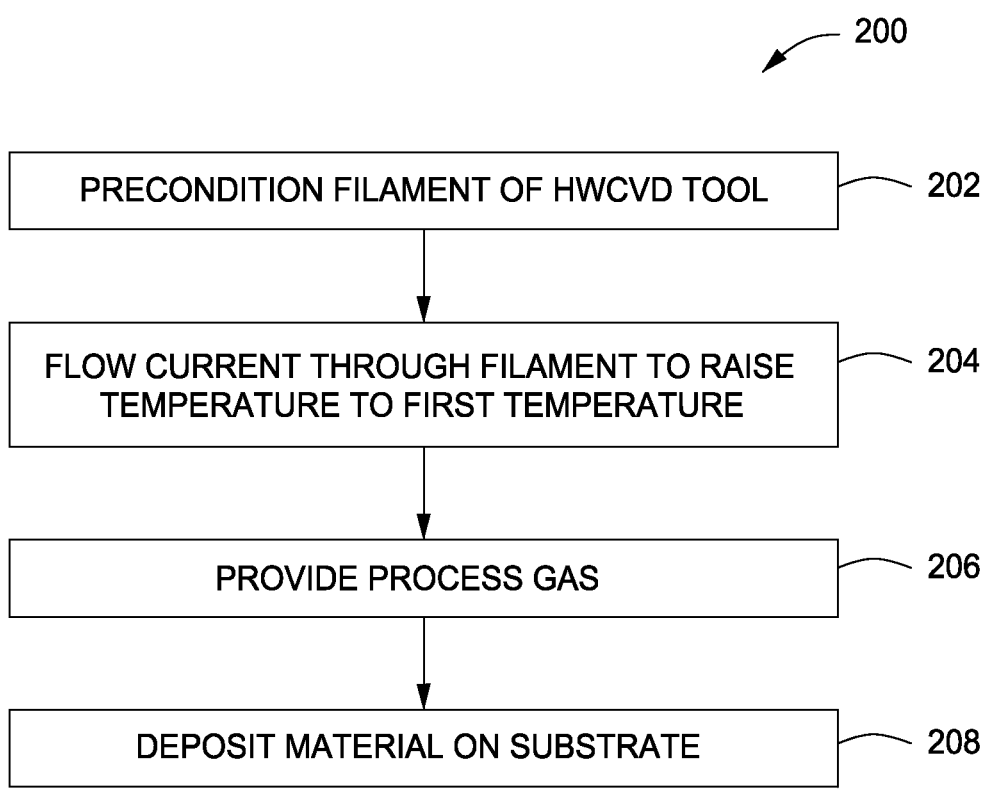
FIG. 2 depicts a flow chart for a method of operating a HWCVD tool in accordance with some embodiments of the present invention.

For example, FIG. 2 depicts a flow chart for a method 200 of operating a HWCVD tool in accordance with some embodiments of the present invention. The method 200 generally begins at 202, where a filament, or a plurality of filaments, disposed in a HWCVD tool may be preconditioned. The filaments may be preconditioned in a hydrogen gas ($H_2$)-containing atmosphere. In some embodiments, the filaments may be preconditioned in accordance with embodiments of the method 100, discussed above. In some embodiments, the filaments may be preconditioned in accordance with embodiments of the method 100, discussed with respect to 102 above.

Next, at 204, current may be flowed through the filaments to raise the temperature of the filaments to a first temperature after preconditioning the filaments. In some embodiments, the current may be provided to the filaments to raise the temperature of the filaments to the first temperature while continuing to provide the hydrogen containing gas. In some embodiments, current may be flowed through the filaments in accordance with embodiments of the method 100, discussed with respect to 104 above.

Next, at 206, a process gas may be provided to the HWCVD tool after the filament is at the first temperature. In some embodiments, the flow of the hydrogen containing gas may be stopped when providing the process gas to the HWCVD tool. The process gas may comprise any suitable process gas to be used in the deposition process. In some embodiments, the process gas may comprise a gas that can thermally decompose when exposed to be heated filaments such that species from the decomposed process gas may be deposited on an underlying substrate. For example, when depositing a silicon containing film, such as microcrystalline silicon or amorphous silicon, the process gas may comprise one or more of silane ($SiH_4$), hydrogen ($H_2$), phosphine ($PH_3$), diborane ($B_2H_6$), or the like.

Next, at 208, a material may be deposited on the substrate using species decomposed from the process gas. As discussed above, the material deposited on the substrate generally comprises species from the process gas. In some embodiments, the material deposited on the substrate may comprise silicon, although other materials are contemplated. Upon completion of the deposition of material at 208 the method 200 generally ends and the substrate may be further processed as desired.

In some embodiments, the method 200 may be repeated as desired to deposit materials on the same substrate or on a second substrate provided to the HWCVD tool. For example, in some embodiments, after the materials deposited on the substrate that 208, the substrate in the chamber may be replaced with a second substrate while maintaining the filament at the first temperature. A second process gas may be provided to the process chamber after the second substrate is provided. The second process gas may be the same as the first process gas (for example, when the same materials to be deposited) or the second process gas may be different than the first process gas (for example, when different materials are to be deposited on the second substrate). A material may then be deposited on the second substrate using species decomposed from the second process gas.

Alternatively or in combination, the flow of current to the filament may be terminated upon completion of deposition of material on the substrate. For example upon completion of deposition of material on the substrate the tool may be turned off for example upon reaching the end of a lot, the end of the shift, the end of the day, into the week, a maintenance period, or any other time when the tool is to be turned off. When the tool is to be started up again, the filament may be subsequently preconditioned in a hydrogen gas (H2)-containing atmosphere. Current may be flowed through the filament to raise the temperature of the filament to a second temperature after preconditioning the filament. A second process gas may be provided to the process chamber after the filament is at the second temperature. As discussed above, the second process gas may be the same or different as the first process gas. A material may be deposited on a second substrate using species decomposed from the second process gas.

Figure 4:
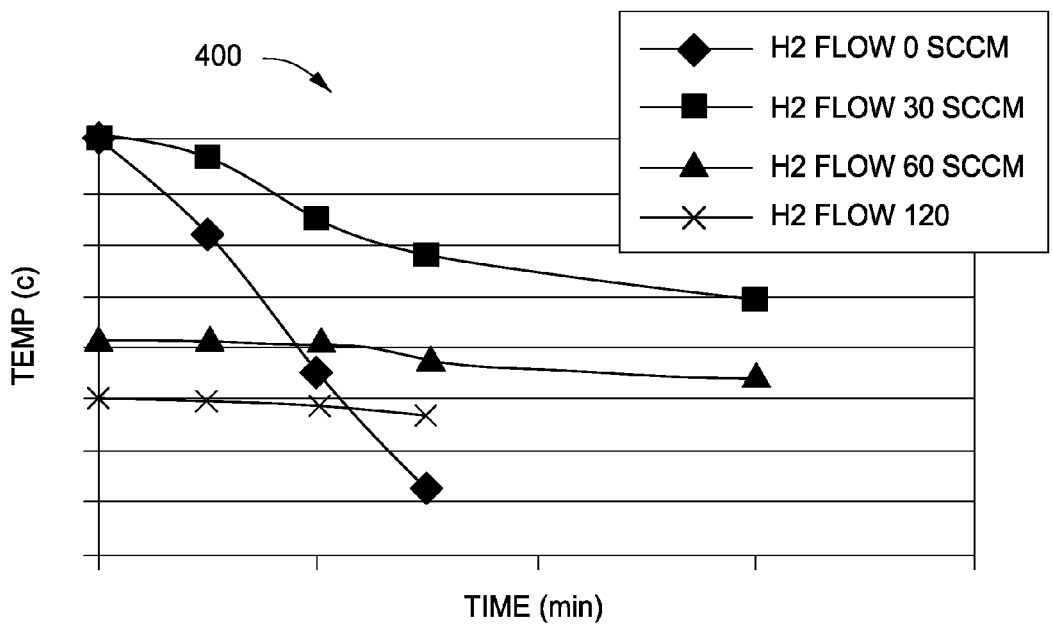
FIG. 4 depicts a graph comparing the temperature of tantalum filaments heated in various atmospheres over time.

FIG. 4 depicts a graph 400 summarizing a constant power test wherein a new tantalum filament was installed in a HWCVD chamber and fired up (e.g., heated) without any hydrogen ($H_2$) gas to a temperature of about 1700 degrees Celsius. The filament temperature decreased rapidly and the filament broke in about 38 minutes. A new tantalum filament was installed and the chamber was flushed with hydrogen (H$_2$) at about 30 sccm for about 5 minutes. After flushing the chamber, the filament was fired up. During this run, the filament temperature gradually decreased. However, the filament did not break—even after 60 minutes. The filament temperature dropped from an initial temperature of about 1700 degrees Celsius to about 1660 degrees Celsius in about 30 minutes. After about 60 minutes the filament temperature reduced to about 1639 degrees Celsius. The same filament was again heated in an even higher hydrogen (H$_2$) gas flow (about 60 sccm). With the higher hydrogen (H$_2$) flow, the filament temperature dropped even more slowly from an initial about 1624 degrees Celsius to about 1609 degrees Celsius over 60 minutes. Again the filament did not break. Another test was conducted with 120 sccm hydrogen (H$_2$) gas flow for 30 minutes, wherein the filament did not break and the temperature drop was only about 4 degrees Celsius over the course of the test.

Figure 3:
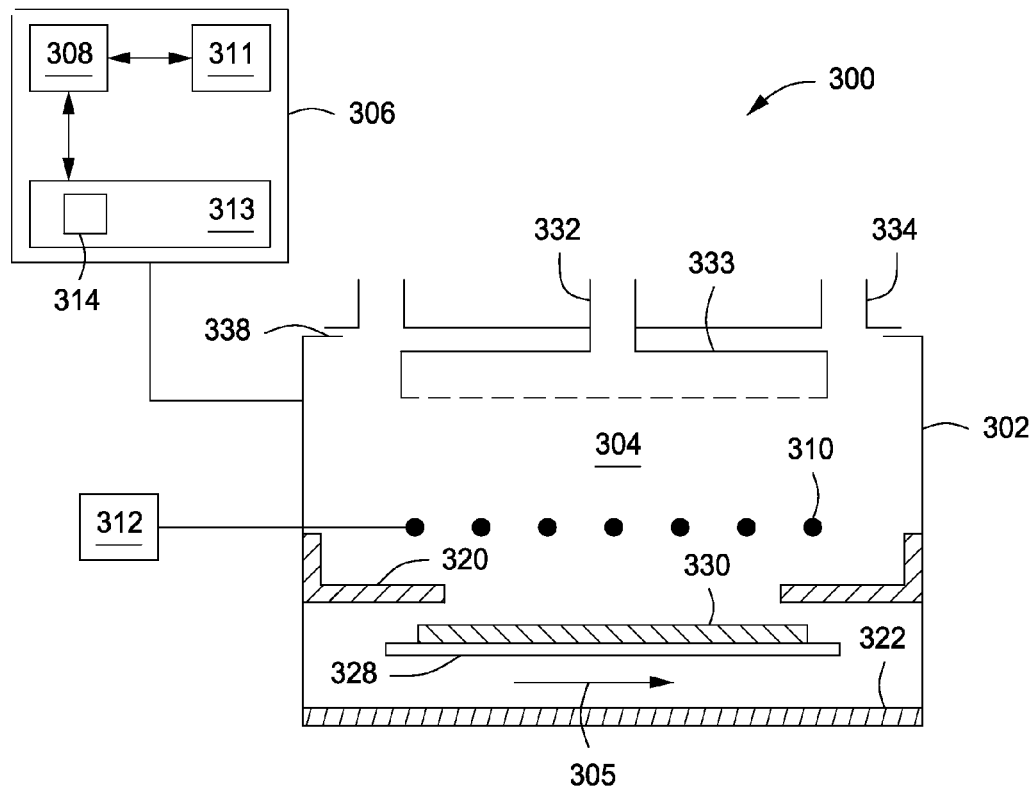
FIG. 3 depicts a schematic side view of a HWCVD process chamber in accordance with some embodiments of the present invention.

FIG. 3 depicts a schematic side view of an HWCVD process chamber 300 suitable for use in accordance with embodiments of the present invention. The process chamber 300 generally comprises a chamber body 302 having an internal processing volume 304. A plurality of filaments, or wires 310, are disposed within the chamber body 302 (e.g., within the internal processing volume 304). The plurality of wires 310 may also be a single wire routed back and forth across the internal processing volume 304. The plurality of wires 310 comprise a HWCVD source. The wires 310 are typically made of tungsten, although tantalum or iridium may also be used. Each wire 310 is clamped in place by support structures (not shown) to keep the wire taught when heated to high temperature, and to provide electrical contact to the wire. A power supply 312 is coupled to the wire 310 to provide current to heat the wire 310. A substrate 330 may be positioned under the HWCVD source (e.g., the wires 310), for example, on a substrate support 328. The substrate support 328 may be stationary for static deposition, or may move (as shown by arrow 305) for dynamic deposition as the substrate 330 passes under the HWCVD source.

The chamber body 302 further includes one or more gas inlets (one gas inlet 332 shown) to provide one or more process gases and one or more outlets (two outlets 334 shown) to a vacuum pump to maintain a suitable operating pressure within the process chamber 300 and to remove excess process gases and/or process byproducts. The gas inlet 332 may feed into a shower head 333 (as shown), or other suitable gas distribution element, to distribute the gas uniformly, or as desired, over the wires 310.

In some embodiments, one or more shields 320 may be provided to minimize unwanted deposition on interior surfaces of the chamber body 302. Alternatively or in combination, one or more chamber liners 322 can be used to make cleaning easier. The use of shields, and liners, may preclude or reduce the use of undesirable cleaning gases, such as the greenhouse gas NF$_3$. The shields 320 and chamber liners 322 generally protect the interior surfaces of the chamber body from undesirably collecting deposited materials due to the process gases flowing in the chamber. The shields 320 and chamber liners 322 may be removable, replaceable, and/or cleanable. The shields 320 and chamber liners 322 may be configured to cover every area of the chamber body that could become coated, including but not limited to, around the wires 310 and on all walls of the coating compartment. Typically, the shields 320 and chamber liners 322 may be fabricated from aluminum (Al) and may have a roughened surface to enhance adhesion of deposited materials (to prevent flaking off of deposited material). The shields 320 and chamber liners 322 may be mounted in the desired areas of the process chamber, such as around the HWCVD sources, in any suitable manner. In some embodiments, the source, shields, and liners may be removed for maintenance and cleaning by opening an upper portion of the deposition chamber. For example, in some embodiments, the a lid, or ceiling, of the deposition chamber may be coupled to the body of the deposition chamber along a flange 338 that supports the lid and provides a surface to secure the lid to the body of the deposition chamber.

A controller 306 may be coupled to various components of the process chamber 300 to control the operation thereof. Although schematically shown coupled to the process chamber 300, the controller may be operably connected to any component that may be controlled by the controller, such as the power supply 312, a gas supply (not shown) coupled to the inlet 322, a vacuum pump and or throttle valve (not shown) coupled to the outlet 334, the substrate support 328, and the like, in order to control the HWCVD deposition process in accordance with the methods disclosed herein. The controller 306 generally comprises a central processing unit (CPU) 308, a memory 313, and support circuits 311 for the CPU 308. The controller 306 may control the HWCVD process chamber 300 directly, or via other computers or controllers (not shown) associated with particular support system components. The controller 306 may be one of any form of general-purpose computer processor that can be used in an industrial setting for controlling various chambers and sub-processors. The memory, or computer-readable medium, 313 of the CPU 308 may be one or more of readily available memory such as random access memory (RAM), read only memory (ROM), floppy disk, hard disk, flash, or any other form of digital storage, local or remote. The support circuits 311 are coupled to the CPU 308 for supporting the processor in a conventional manner. These circuits include cache, power supplies, clock circuits, input/output circuitry and subsystems, and the like. Inventive methods as described herein may be stored in the memory 313 as software routine 314 that may be executed or invoked to turn the controller into a specific purpose controller to control the operation of the process chamber 300 in the manner described herein. The software routine may also be stored and/or executed by a second CPU (not shown) that is remotely located from the hardware being controlled by the CPU 308.

Thus, methods for extending the lifetime of tantalum filaments in HWCVD processes have been provided herein. Embodiments of the inventive methods disclosed herein may provide one or more of the following benefits: improved film quality as compared to use of tungsten filaments, extended filament lifetime, greater equipment uptime, higher yield, and higher throughput.

While the foregoing is directed to embodiments of the present invention, other and further embodiments of the invention may be devised without departing from the basic scope thereof.

The invention claimed is:

1. A method of operating a hot wire chemical vapor deposition (HWCVD) tool, comprising:
providing hydrogen gas (H$_2$) sufficient to blanket a tantalum filament disposed in a process chamber of the HWCVD tool for a first period of time selected to facilitate scavenging residual oxygen from the process chamber; and
flowing current through the tantalum filament to raise the temperature of the tantalum filament to a first temperature after the first period of time, wherein the first temperature is a temperature at which a CVD deposition process is to subsequently occur.

2. The method of claim 1, wherein the first temperature is about 1500 to about 2400 degrees Celsius.

3. The method of claim 1, wherein a pressure within the process chamber is maintained at approximately 1 millitorr.

4. The method of claim 1, wherein providing hydrogen gas further comprises providing hydrogen gas and an inert carrier gas.

5. The method of claim 4, wherein the inert carrier gas comprises at least one of nitrogen, argon, or helium.

6. The method of claim 1, wherein the first period of time ranges from about 5 to about 1800 seconds.

7. A method of operating a hot wire chemical vapor deposition (HWCVD) tool, comprising:
   preconditioning a tantalum filament disposed in a process chamber of the HWCVD tool in a hydrogen gas ($H_2$)-containing atmosphere sufficient to blanket the tantalum filament for a period of time selected to scavenge residual oxygen from the process chamber;
   flowing current through the tantalum filament to raise the temperature of the tantalum filament to a first temperature after preconditioning the tantalum filament, wherein the first temperature is a temperature at which a CVD deposition process is to subsequently occur;
   providing a process gas to the process chamber after the tantalum filament is at the first temperature; and
   depositing a material on the substrate using species decomposed from the process gas.

8. The method of claim 7, wherein the first temperature is about 1500 to about 2400 degrees Celsius.

9. The method of claim 7, wherein a pressure within the process chamber is maintained at approximately 1 millitorr.

10. The method of claim 7, wherein preconditioning the tantalum filament in the hydrogen gas ($H_2$)-containing atmosphere comprises providing hydrogen gas and an inert carrier gas.

11. The method of claim 10, wherein the inert carrier gas comprises at least one of nitrogen, argon, or helium.

12. The method of claim 7, wherein the first period of time ranges from about 5 to about 1800 seconds.

13. The method of claim 7, wherein providing the process gas further comprises terminating a flow of hydrogen gas provided to maintain the hydrogen gas ($H_2$)-containing atmosphere.

14. The method of claim 7, wherein the process gas comprises one of silane ($SiH_4$), hydrogen ($H_2$), phosphine ($PH_3$), or diborane ($B_2H_6$).

15. The method of claim 7, further comprising:
   terminating the flow of current to the tantalum filament upon completion of deposition of material on the substrate;
   subsequently preconditioning the tantalum filament in a hydrogen gas ($H_2$)-containing atmosphere;
   flowing current through the tantalum filament to raise the temperature of the tantalum filament to a second temperature after preconditioning the tantalum filament;
   providing a second process gas to the process chamber after the tantalum filament is at the second temperature; and
   depositing a material on a second substrate using species decomposed from the second process gas.

16. The method of claim 7, further comprising:
   replacing the substrate in the chamber with a second substrate while maintaining the tantalum filament at the first temperature;
   providing a second process gas to the process chamber after the second substrate is provided; and
   depositing a material on the second substrate using species decomposed from the second process gas.

* * * * *

UNITED STATES PATENT AND TRADEMARK OFFICE
CERTIFICATE OF CORRECTION

PATENT NO. : 8,709,537 B2
APPLICATION NO. : 13/267309
DATED : April 29, 2014
INVENTOR(S) : Thakur et al.

It is certified that error appears in the above-identified patent and that said Letters Patent is hereby corrected as shown below:

In the Claims

In column 7, line 18, Claim 7, delete the phrase "a period" and substitute therefor --a first period--

Signed and Sealed this
Seventh Day of April, 2015

Michelle K. Lee
*Director of the United States Patent and Trademark Office*